(12) United States Patent
Takemura

(10) Patent No.: US 9,230,615 B2
(45) Date of Patent: Jan. 5, 2016

(54) SEMICONDUCTOR MEMORY DEVICE AND METHOD FOR DRIVING THE SAME

(71) Applicant: Semiconductor Energy Laboratory Co., Ltd.

(72) Inventor: Yasuhiko Takemura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 480 days.

(21) Appl. No.: 13/655,077

(22) Filed: Oct. 18, 2012

(65) Prior Publication Data

US 2013/0100748 A1 Apr. 25, 2013

(30) Foreign Application Priority Data

Oct. 24, 2011 (JP) .................................. 2011-232374

(51) Int. Cl.
  *G11C 7/08* (2006.01)
  *G11C 7/02* (2006.01)
  *G11C 11/4091* (2006.01)
  *G11C 11/4094* (2006.01)

(52) U.S. Cl.
  CPC .. *G11C 7/02* (2013.01); *G11C 7/08* (2013.01); *G11C 11/4091* (2013.01); *G11C 11/4094* (2013.01)

(58) Field of Classification Search
  CPC ............ G11C 7/02; G11C 7/08; G11C 7/065; G11C 11/4091; G11C 11/4094; G11C 11/4096; G11C 11/41
  See application file for complete search history.

(56) References Cited

U.S. PATENT DOCUMENTS

| 5,353,255 | A | 10/1994 | Komuro |
| 5,495,440 | A | 2/1996 | Asakura |
| 6,377,504 | B1 * | 4/2002 | Hilbert ..................... 365/230.03 |
| 7,772,053 | B2 | 8/2010 | Kameshiro et al. |
| 2008/0308848 | A1 * | 12/2008 | Inaba ............................ 257/255 |
| 2011/0156027 | A1 | 6/2011 | Yamazaki et al. |

FOREIGN PATENT DOCUMENTS

| JP | 07-211094 A | 8/1995 |
| KR | 201000100132 A1 * | 9/2010 |

OTHER PUBLICATIONS

Kiyoshi Takeuchi et al.; "Channel Engineering for the Reduction of Random-Dopant-Placement-Induced Threshold Voltage Fluctuation"; Technical Digest of International Electron Devices Meeting; 1997; pp. 841-844.

W. Mueller et al.; "Challenges for the DRAM Cell Scaling to 40nm"; Technical Digest of International Electron Devices Meeting; 2005; pp. 347-350.

* cited by examiner

*Primary Examiner* — Douglas King

(74) *Attorney, Agent, or Firm* — Fish & Richardson P.C.

(57) ABSTRACT

In a conventional DRAM, data read errors are more likely to occur along with miniaturization of DRAM A small change in the potential of a first bit line is inverted by a first inverter constituted by an n-channel transistor and a p-channel transistor, and is output to a second bit line through a first selection transistor, which is a first switch. Since the potential of the second bit line is the inverse of the potential of the first bit line, the potential difference between the first bit line and the second bit line is increased. The increased potential difference is amplified by a known sense amplifier, a flip-flop circuit composed of the first inverter and a second inverter (constituted by an n-channel transistor and a p-channel transistor), or the like.

12 Claims, 7 Drawing Sheets

SEMICONDUCTOR MEMORY DEVICE AND METHOD FOR DRIVING THE SAME

BACKGROUND OF THE INVENTION

1. Field of the Invention

The present invention relates to a memory device using a semiconductor.

2. Description of the Related Art

Terms used in this specification will be briefly explained. First, when one of a source and a drain of a transistor is called a drain, the other is called a source in this specification. That is, they are not distinguished depending on the potential level. Thus, a portion called a source in this specification can alternatively be referred to as a drain.

In this specification, "connection" means a structure in which effective direct current can be supplied at least temporarily. Therefore, a state of connection means not only a state of direct connection but also a state of indirect connection through a circuit element such as a wiring or a resistor, in which direct current can be supplied. It does not matter whether a circuit is actually designed so that direct current is supplied thereto.

For example, in the case where a switching element is provided between two nodes, direct current can be supplied in a certain condition (i.e., only when the switch is on); therefore, the structure can be expressed as "the nodes are connected to each other". On the other hand, in the case where only a capacitor is provided between two nodes, effective direct current cannot be supplied through the capacitor; therefore, the structure can be expressed as "the nodes are not connected to each other".

Similarly, in the case where only a diode is provided between nodes, direct current can be supplied when the potential of one of the nodes is higher; therefore, the structure can be expressed as "the nodes are connected to each other". In this case, even if potentials with which current does not flow are supplied to the two nodes because of the circuit design (in which case current does not actually flow between the two nodes through the diode), the structure is expressed as "the nodes are connected to each other" in this specification.

For example, in the case where a node A is connected to a source of a transistor and a node B is connected to a drain of the transistor, direct current can flow between the node A and the node B depending on the potential of a gate; thus, the structure is expressed as "the node A and the node B are connected to each other".

On the other hand, in the case where the node A is connected to the source of the transistor and a node C is connected to the gate of the transistor, effective direct current cannot flow between the node A and the node C regardless of the potentials of the source, drain, and gate of the transistor; thus, the structure is expressed as "the node A and the node C are not connected to each other".

In the above description, effective direct current refers to current excluding unintentional current such as leakage current. Note that the value of effective direct current is not defined by its amount (absolute value) and sometimes depends on circuits. That is, in some cases, a low current of 1 pA can be effective current in one circuit, whereas a higher current of 1 µA is not considered as effective current in another circuit.

Needless to say, in one circuit having an input and an output (e.g., an inverter), the input and the output are not necessarily connected to each other. Using the inverter as an example, the input and the output are not connected to each other in the inverter.

When the term "connect" is used in this specification, there is a case in which a physical connection is not clear in an actual circuit and a wiring is only extended. For example, in a circuit composed of insulated-gate field-effect transistors (hereinafter simply referred to as transistors), one wiring serves as gates of a plurality of transistors in some cases. In this case, one wiring that branches into gates may be illustrated in a circuit diagram. In this specification, the expression "a wiring is connected to a gate" may be used even in such a case.

Further, in this specification, in referring to a specific row, column, or position in a matrix, a reference sign is accompanied by a sign denoting coordinates as follows, for example: "memory cell MC_1_1" and "bit line BL_2". When one element has a function shared with a plurality of rows or columns, the element may be represented by, for example, "sense amplifier SA_1/2".

On the other hand, when a row, column, or position of an element is not specified, when elements are collectively treated, or when the position of an element is obvious, the following expressions may be used, for example: "memory cell(s) MC" and "bit line(s) BL", or simply "memory cell(s)" and "bit line(s)".

A DRAM whose memory cell includes one transistor and one capacitor can be highly integrated, has no limit on the number of write cycles in principle, and can perform write and read operations at relatively high speed; thus, such a DRAM is used in many kinds of electronic devices. A DRAM stores data by accumulating electric charge in a capacitor of each memory cell, and reads the data by releasing the electric charge.

Several tens of refresh operations per second are conventionally required because silicon is used for a transistor, whereas a transistor including an oxide semiconductor, which has a wider bandgap, can store data substantially permanently (see Patent Document 1). In addition, the use of an extremely thin silicon film can reduce the off-state current of a transistor by three or more orders of magnitudes compared to a conventional one (see Patent Document 2).

FIGS. 2A and 2B illustrate a circuit and a method for reading data from a conventional DRAM. The DRAM illustrated in FIG. 2A is a folded bit line DRAM circuit and includes a pair of bit lines BL_1 and BL_2, word lines WL_1, WL_2, WL_3, WL_4, and the like, and memory cells MC_1_1, MC_2_2, MC_3_1, MC_4_2, and the like that are placed at the intersections of the bit lines and the word lines.

A sense amplifier SA_1/2 is provided at one end of the bit lines BL_1 and BL_2. The sense amplifier is usually a flip-flop circuit.

FIG. 2B is a timing chart for driving the memory cells and the sense amplifier. Here, a capacitor in the memory cell MC is charged with +1 V as one-bit data representing "1" and charged with 0 V as one-bit data representing "0".

Data in the memory cell MC_1_1 is read in the following manner. First, the bit lines BL_1 and BL_2 are precharged with +0.5 V by a precharge circuit (not illustrated). Then, the bit lines BL_1 and BL_2 are brought into a floating state. Here, in the flip-flop sense amplifier SA_1/2, a wiring VPS for supplying its potential to sources of p-channel transistors TPU and TPD and a wiring VNS for supplying its potential to sources of n-channel transistors TNU and TND have a potential of +0.5 V.

After that, the potential of the word line WL_1 is set at an appropriate value to turn on the cell transistor in the memory cell MC_1_1 (time T1 in FIG. 2B). Note that the operation "changing a potential of a wiring to turn on a transistor connected to the wiring" is referred to as setting the potential of the wiring at the ON potential. By this operation, electric charge stored in the capacitor in the memory cell MC_1_1 is discharged to the bit line BL_1.

The potential of the bit line BL_1 is determined by the capacitance of the capacitor in the memory cell MC_1_1 and the capacitance of the bit line BL_1. Here, since the potential of the capacitor in the memory cell is originally 0 V, the potential of the bit line BL_1 falls from the precharge potential to +0.4 V, for example.

On the other hand, the potential of the bit line BL_2 does not change and remains at +0.5 V even when the potential of the word line WL_1 is set at the ON potential, because there is no memory cell connected to the bit line BL_2. That is, the potential of the bit line BL_1 is lower than that of the bit line BL_2 by 0.1 V.

Then, the potential of the wiring VPS of the sense amplifier SA_1/2 starts to be raised to +1 V at a given speed, and the potential of the wiring VNS starts to be lowered to 0 V at a similar speed (time T2 in FIG. 2B). Accordingly, the p-channel transistor TPD and the n-channel transistor TNU are turned on at a given moment.

Consequently, the potential of the bit line BL_1, which is relatively low, is further lowered and the potential of the bit line BL_2, which is relatively high, is further raised, and in the end, the potential of the bit line BL_1 becomes 0 V and the potential of the bit line BL_2 becomes +1 V.

It is preferable that the speed of change in the potential of the wiring VPS and the potential of the wiring VNS be sufficiently low at an early stage of the amplification process. This is because, when the potential difference at an early stage of the amplification is as small as 0.1 V as described above, amplification fails if the potential of the wiring VPS and the potential of the wiring VNS are rapidly changed. For that reason, the amplification requires time.

In contrast, if it takes long time to complete the amplification, the possibility of reading failure due to external noise increases particularly at an early stage of the amplification.

The threshold voltage variation of the transistors included in the sense amplifier SA_1/2 is required to be small because the sense amplifier SA_1/2 amplifies a potential difference as small as 0.1 V. Given that, for example, the threshold voltages of the n-channel transistor TNU, the p-channel transistor TPU, the n-channel transistor TND, and the p-channel transistor TPD are +0.35 V, −0.45 V, +0.45 V, and −0.35V, respectively, both the p-channel transistor TPU and the p-channel transistor TPD are turned on in the amplification process and data reading fails in some cases.

In general, the threshold voltage variation of the transistors included in a sense amplifier needs to be less than half, preferably less than 30% of the potential difference between bit lines at an early stage of amplification. In the above case, an error is likely to occur at the time of amplification since the threshold voltage variation of the transistors is 50 mV and the potential difference between the bit lines at an early stage of the amplification is 0.1 V.

In general, the threshold voltage variation of transistors is broadly classified into three types: lot-to-lot variation (substrate-to-substrate variation), chip-to-chip variation (variation within one substrate), and variation between adjacent transistors.

Lot-to-lot variation depends on difference in process condition, film thickness, and line width between lots. Chip-to-chip variation is due to variation in dose, film thickness, and line width within one substrate. Either variation is macroscopic variation, and threshold voltage variation caused by these factors can be corrected by substrate bias, for example.

On the other hand, variation between adjacent transistors is mainly due to statistical fluctuations in dopant concentration (see Non-Patent Document 1) and increases as the transistors are reduced in size. In other words, the reduction in size of transistors for high integration of DRAM makes the operation of a sense amplifier unstable.

In the case of using a semiconductor whose mobility is lower than that of silicon by one or more orders of magnitude, such as an oxide semiconductor, the capacitance of a capacitor needs to be lower than that of an ordinal capacitor by one or more orders of magnitude in order to access data at high speed. If the number of memory cells connected to one bit line is equivalent to that in a conventional DRAM, the change in the potential of the bit line at the time of data reading becomes smaller and thus an error is likely to occur.

According to Non-Patent Document 2, when the number of memory cells connected to a bit line is 256, the capacitance of the bit line is 35 fF with a circuit line width of 40 nm. If 256 memory cells are connected to one bit line while the capacitance of a capacitor is 3 fF, the change in the potential of the bit line is approximately 40 mV; thus, a technique of amplifying such a small potential change in a short time without errors is required.

REFERENCES

Patent Document 1: United States Patent Application Publication No. 2011/0156027
Patent Document 2: U.S. Pat. No. 7,772,053
Non-Patent Document 1: K. Takeuchi et al., "Channel Engineering for the Reduction of Random-Dopant-Placement-Induced Threshold Voltage Fluctuation", *Technical Digest of International Electron Devices Meeting*, pp. 841-844, 1997.
Non-Patent Document 2: W. Mueller et al., "Challenges for the DRAM Cell Scaling to 40 nm", *Technical Digest of International Electron Devices Meeting*, pp. 347-350, 2005.

SUMMARY OF THE INVENTION

An object of one embodiment of the present invention is to solve any of the above problems. Specifically, an object of one embodiment of the present invention is to provide a semiconductor memory device that is less likely to malfunction even when the change in the potential of a bit line is small. Another object of one embodiment of the present invention is to provide a semiconductor memory device that is less likely to malfunction even when the threshold voltage variation of transistors is large. Another object of one embodiment of the present invention is to provide a semiconductor memory device that is less likely to malfunction even when the circuit is miniaturized.

An object of one embodiment of the present invention is to provide a memory device that functions sufficiently even when the capacitance of a capacitor is smaller than or equal to that in a conventional DRAM, specifically 10 fF or less, preferably 1 fF or less.

Further, an object of one embodiment of the present invention is to provide a memory device having a novel structure and a method for driving the memory device, particularly a low-power memory device and a method for driving the memory device.

One embodiment of the present invention is a semiconductor memory device including a first bit line, a second bit line, an inverter and a switch between the first bit line and the second bit line, and a memory cell connected to one of the first bit line and the second bit line. The inverter is connected in series with the switch.

One embodiment of the present invention is a method for driving the above semiconductor memory device, including the successive steps of turning on the switch and amplifying a potential difference between the first bit line and the second bit line.

Another embodiment of the present invention is a semiconductor memory device including a first bit line; a second bit line; a first inverter, a first switch, a second inverter, and a second switch that are placed between the first bit line and the second bit line; and a memory cell connected to one of the first bit line and the second bit line. The first inverter is connected to the first switch. The second inverter is connected to the second switch. The first bit line is connected to the first inverter. The second bit line is connected to the first switch. The first bit line is connected to the second switch. The second bit line is connected to the second inverter.

One embodiment of the present invention is a method for driving the above semiconductor memory device, including the successive steps of turning on the first switch, and forming a loop of the first inverter, the first switch, the second inverter, and the second switch by turning on the second switch.

As the inverter (or the first and second inverters), various types of inverters can be used. For example, a CMOS inverter, a resistive load inverter, a clocked inverter, or the like or a combination of such inverters can be used.

In the above semiconductor memory devices, transistors in the memory cells and transistors in the inverter may be provided in different layers, and the transistors in the inverter are preferably formed using a single crystal semiconductor. The threshold voltage variation of the transistors needs to be sufficiently small in the inverter; therefore, the channel area of the transistor in the inverter is preferably 4 times or more, further preferably 16 times or more that of the transistor in the memory cell.

The length in the word line direction of the area occupied by the inverter is preferably 3 times or more, further preferably 5 times or more the width of the bit line. Similarly, the length in the bit line direction of the area occupied by the inverter is preferably 3 times or more, further preferably 5 times or more the width of the word line.

Although the inverter occupies a large area as above, a sufficiently large channel area of the transistors included in the inverter can reduce the threshold voltage variation of the transistors due to statistical fluctuations in impurity concentration. In the case where the memory cells are formed using a thin-film-shaped semiconductor, the memory cells can be formed to overlap the inverter or the like, resulting in higher integration.

In the above semiconductor memory devices, the switch (or each of the first and second switches) can be composed of at least one transistor. The switch can be constituted most simply by using one n-channel transistor or one p-channel transistor. Alternatively, the switch may be a transmission gate, in which two or more transistors with different conductivity types are connected in parallel.

At least one of the aforementioned objects can be achieved by employing any of the above configurations. In one embodiment of the present invention, when the switch (or the first switch) is turned on and the potential of the inverter (or the first inverter) is set at the ON potential, the potential of the second bit line changes to a potential of opposite phase to the potential of the first bit line in accordance with the potential of the first bit line. In other words, the potential of the second bit line becomes lower than the threshold voltage of the inverter when the potential of the first bit line is higher than the threshold voltage of the inverter, whereas the potential of the second bit line becomes higher than the threshold voltage of the inverter when the potential of the first bit line is lower than the threshold voltage of the inverter.

For example, an assumption is made that the threshold voltages of a p-channel transistor and an n-channel transistor constituting the inverter range from −0.45 V to −0.35 V and from +0.35 V to +0.45 V, respectively, and the source potentials of the p-channel transistor and the n-channel transistor are +1 V and 0 V, respectively. When the potential of an input of the inverter (i.e., the potential of the first bit line) is +0.4 V, the potential of an output of the inverter (i.e., the potential of the second bit line) can be +0.75 V or higher in the state where enough time passes after a signal is input to the inverter.

In a short period such as a reading step, the potential of the second bit line is lowered by the resistance of the transistors constituting the inverter and the resistance and capacitance of the second bit line, and yet the potential of the second bit line can be +0.6 V or higher within a period needed.

Thus, the potential difference between the first bit line and the second bit line is 0.2 V or larger, so that occurrence of errors is prevented as much as possible even in the case of using a sense amplifier composed of transistors with the same threshold voltage variation as the transistors of the inverter.

Since the potential difference between the first bit line and the second bit line at the start of amplification can be larger, the potential difference between sources of an n-channel transistor and a p-channel transistor included in a sense amplifier connected to the first bit line and the second bit line can be rapidly increased. As a result, the time required for reading can be shortened.

A larger potential difference between the first bit line and the second bit line at the start of amplification or a shorter time necessary for amplification makes the sense amplifier less likely to be affected by noise in the amplification process.

In an open bit line DRAM in particular, the probability of read errors due to the influence of noise is higher than that in a folded bit line DRAM because a bit line used for reading and a bit line whose potential is used as a reference potential are separately placed. In one embodiment of the present invention, the influence of noise is relatively small, so that remarkable effects are obtained in an open bit line DRAM.

Note that errors are likely to occur in a flip-flop sense amplifier composed of transistors with the above-described threshold voltage variation when a potential difference of 0.1 V is amplified, whereas an inverter composed of transistors with the same threshold voltage variation can invert and amplify a potential difference of 0.1 V. One embodiment of the present invention can obtain advantageous effects by using this feature effectively.

DETAILED DESCRIPTION OF THE INVENTION

Embodiments will be hereinafter described with reference to the accompanying drawings. Note that the embodiments can be implemented in various modes. It will be readily appreciated by those skilled in the art that modes and details can be changed in various ways without departing from the spirit and scope of the present invention. Thus, the present invention should not be interpreted as being limited to the following description of the embodiments.

Note that specific values of potentials are given below for understanding a technical idea of the present invention. Needless to say, such values are changed in accordance with a variety of characteristics of a transistor, a capacitor, or the like or the convenience of the practitioner.

In semiconductor memory devices described in the following embodiments, data can be written and read using a method other than methods described below.

(Embodiment 1)

In Embodiment 1, examples of a semiconductor memory device according to one embodiment of the present invention and its operation will be described with reference to FIGS. 1A and 1B and FIG. 4A.

Figure 1A:
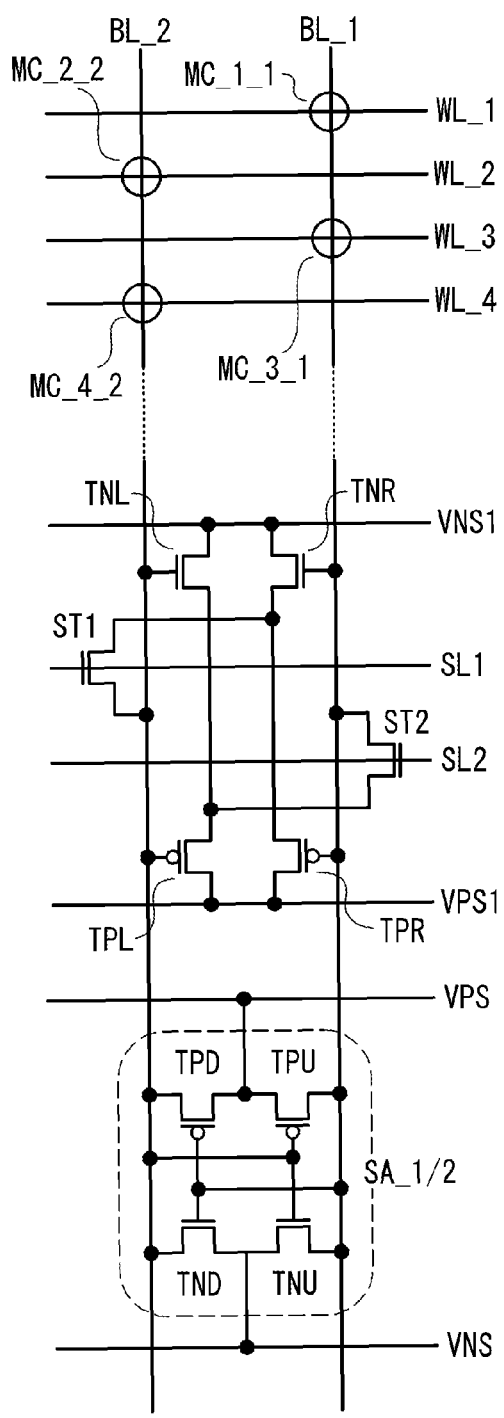
FIGS. 1A and 1B each illustrate a circuit example of a semiconductor memory device of the present invention.

The semiconductor memory device illustrated in FIG. 1A includes word lines WL, bit lines BL perpendicular to the word lines WL, a first selection line SL1 and a second selection line SL2 parallel to the word lines WL, and a plurality of memory cells MC. The semiconductor memory device also includes a first selection transistor ST1, a second selection transistor ST2, a p-channel transistor TPL, a p-channel transistor TPR, an n-channel transistor TNL, an n-channel transistor TNR, and a wiring VPS1 and a wiring VNS1 that supply potentials to sources of these p-channel and n-channel transistors.

The p-channel transistor TPR and the n-channel transistor TNR constitute a first inverter. The p-channel transistor TPL and the n-channel transistor TNL constitute a second inverter. A source of the first selection transistor ST1 is connected to the bit line BL_2, a drain thereof is connected to a drain of the n-channel transistor TNR and a drain of the p-channel transistor TPR (i.e., an output terminal of the first inverter), and a gate thereof is connected to the first selection line SL1. A source of the second selection transistor ST2 is connected to the bit line BL_1, a drain thereof is connected to a drain of the n-channel transistor TNL and a drain of the p-channel transistor TPL (i.e., an output terminal of the second inverter), and a gate thereof is connected to the second selection line SL2.

The semiconductor memory device also includes a sense amplifier SA_1/2 and a wiring VPS and a wiring VNS that supply potentials to sources of transistors included in the sense amplifier SA_1/2. The sense amplifier SA_1/2 is used to amplify the potential difference between the bit line BL_1 and the bit line BL_2 as in a conventional DRAM.

An example of data reading in such a semiconductor memory device will be described. Here, the case where data in the memory cell MC_1_1 is read is described. In this embodiment, the average threshold voltage of the n-channel transistors is +0.4 V and the threshold voltage variation thereof is 50 mV, while the average threshold voltage of the p-channel transistors is −0.4 V and the threshold voltage variation thereof is 50 mV.

As in a conventional DRAM, the bit lines BL_1 and BL_2 are precharged with +0.5 V by a precharge circuit (not illustrated) and then brought into a floating state. The potentials of the wiring VPS and the wiring VNS in the sense amplifier SA_1/2 are +0.5 V. The potential of the wiring VPS1 is +1 V. The potential of the wiring VNS1 is 0 V.

Figure 4A:
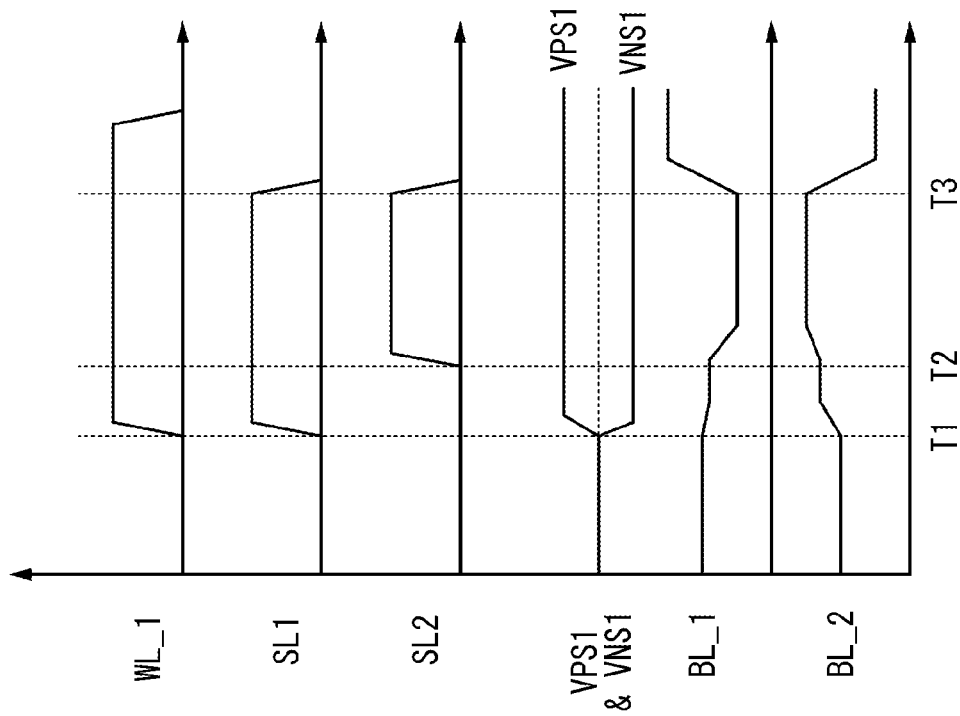
FIGS. 4A and 4B each illustrate an example of a method for driving a semiconductor memory device of the present invention.

After that, the potential of the word line WL_1 is set at the ON potential to turn on the cell transistor in the memory cell MC_1_1 (time T1 in FIG. 4A). Accordingly, electric charge stored in the capacitor in the memory cell MC_1_1 is discharged to the bit line BL_1.

The potential of the bit line BL_1 is determined by the capacitance of the capacitor in the memory cell MC_1_1 and the capacitance of the bit line BL_1. Here, the potential of the capacitor in the memory cell MC_1_1 is originally 0 V, so that the potential of the bit line BL_1 falls from the precharge potential to +0.4 V, for example.

In addition, the potential of the first selection line SL1 is set at the ON potential at the time T1, thereby turning on the first selection transistor ST1. Alternatively, the timing at which the potential of the first selection line SL1 is set at the ON potential may be before or after the time T1. Since the potential of the bit line BL_1 is +0.4 V, the first inverter composed of the p-channel transistor TPR and the n-channel transistor TNR outputs a potential higher than the precharge potential (+0.5 V) even when the threshold voltage variation of the transistors is taken into consideration. The output potential is transmitted to the bit line BL_2 through the first selection transistor ST1, and the potential of the bit line BL_2 becomes higher than the precharge potential.

Then, the potential of the wiring VPS starts to be raised to +1 V and the potential of the wiring VNS starts to be lowered to 0 V, thereby activating the sense amplifier SA_1/2 (time T2 in FIG. 4A). Data can be amplified in such a manner. A conventional DRAM requires a long time to amplify data. In contrast, in the semiconductor memory device of this embodiment, the amplification starts when the difference between the potentials of the bit lines BL_1 and BL_2 are sufficiently large, so that an amplification error is unlikely to occur even if the speed of potential change is increased; thus, the time needed for the amplification can be shortened. Moreover, a short time needed for the amplification allows the sense amplifier to be less affected by external noise in this period, resulting in decrease in the possibility of reading failure.

Figure 1B:
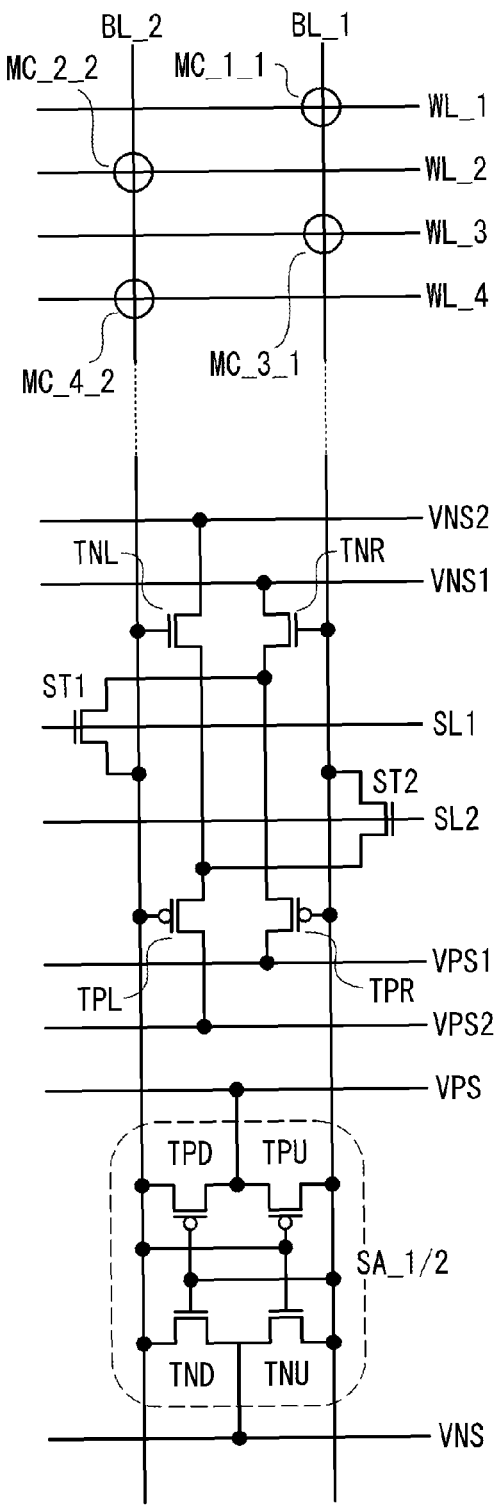
Figure 2A:
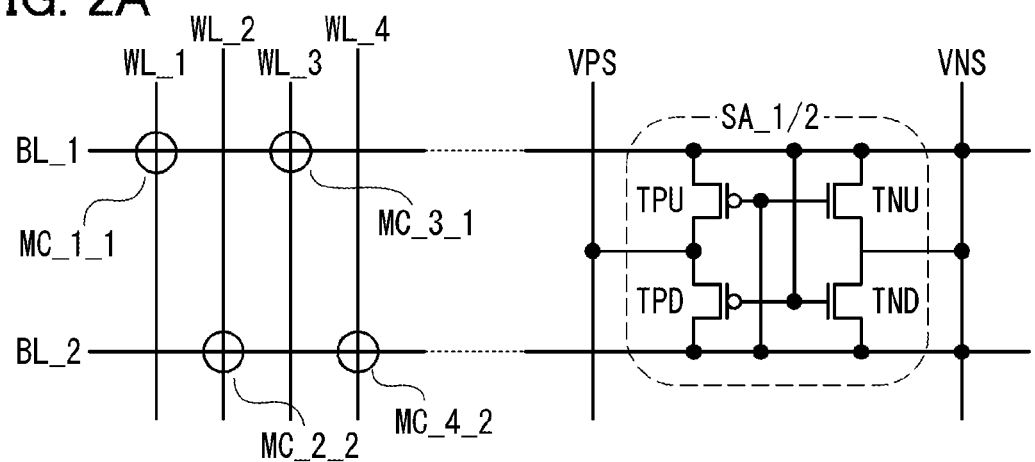
FIGS. 2A and 2B illustrate a circuit example of a conventional semiconductor memory device and a driving method thereof.
Figure 2B:
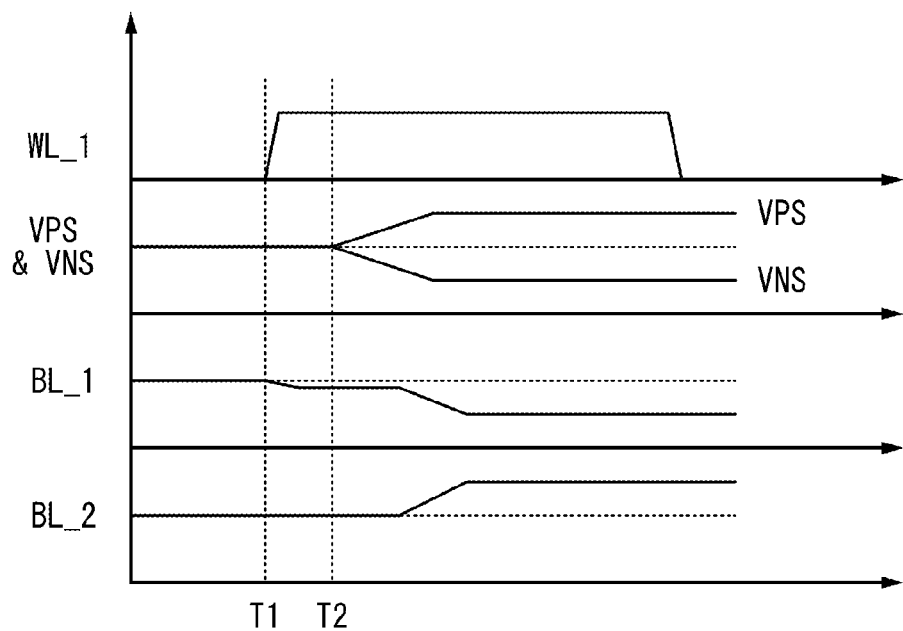

In the semiconductor memory device illustrated in FIG. 1A, power supply voltages for the first inverter and the second inverter are controlled at the same time; alternatively, the power supply voltages for the first inverter and the second inverter may be individually controlled as illustrated in FIG. 1B. That is, the wiring VPS1 and the wiring VNS1 that supply power to the first inverter and a wiring VPS2 and a wiring VNS2 that supply power to the second inverter may be separately provided.

In the above-described example, although the second inverter is not used to read data, a shoot-through current flows between the p-channel transistor TPL and the n-channel transistor TNL when there is a potential difference between the wiring VPS1 and the wiring VNS1. The shoot-through current can be eliminated by setting the power supply voltage for the second inverter at 0 (e.g., by setting the potentials of the wiring VPS2 and the wiring VNS2 at +0.5 V so that the difference between these potentials is 0). Thus, power consumption can be reduced.

Further, the first and second inverters are powered on from the beginning in the above example; alternatively, it is also preferable that the power be turned on at, before, or after the time T1 and be turned off at, before, or after the time T2 in terms of lower power consumption. Note that the largest shoot-through current flows through the inverter in this embodiment when an input potential is around the precharge potential; therefore, powering on and off the first and second inverters frequently is effective in reducing power consumption.

In order to further reduce power consumption, if the power supply voltages for the first inverter and the second inverter can be individually controlled, it is preferable that the power supply voltage for the second inverter be 0 and the first inverter be powered on at, before, or after the time T1 and powered off at, before, or after the time T2.

(Embodiment 2)

In Embodiment 2, examples of a semiconductor memory device according to one embodiment of the present invention and its operation will be described with reference to FIGS. 3A and 3B and FIG. 4B.

Figure 3A:
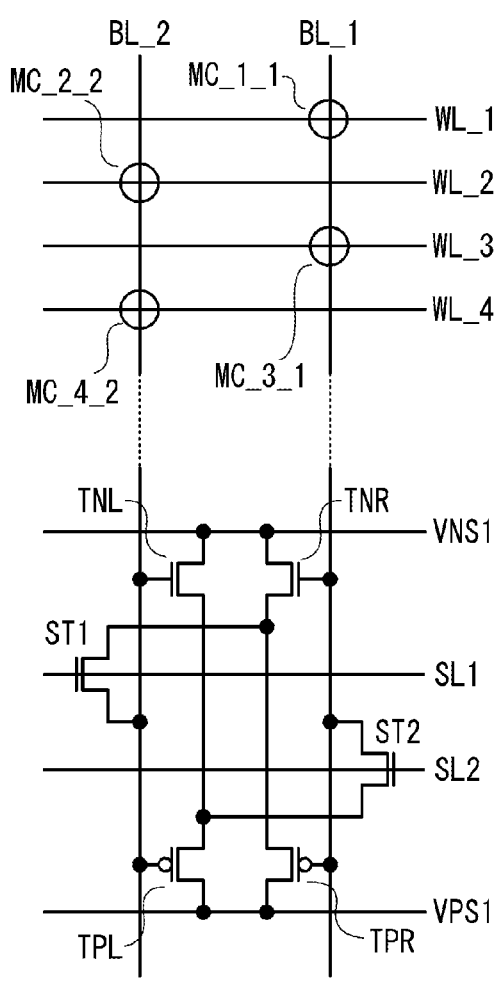
FIGS. 3A and 3B each illustrate a circuit example of a semiconductor memory device of the present invention.

The semiconductor memory device illustrated in FIG. 3A includes the word lines WL, the bit lines BL perpendicular to the word lines WL, the first selection line SL1 and the second selection line SL2 parallel to the word lines WL, and a plurality of memory cells MC. The semiconductor memory device also includes the first selection transistor ST1, the second selection transistor ST2, the p-channel transistor TPL, the p-channel transistor TPR, the n-channel transistor TNL, the n-channel transistor TNR, and the wiring VPS1 and the wiring VNS1 that supply potentials to sources of these p-channel and n-channel transistors.

The p-channel transistor TPR and the n-channel transistor TNR constitute a first inverter. The p-channel transistor TPL and the n-channel transistor TNL constitute a second inverter. A source of the first selection transistor ST1 is connected to the bit line BL_2, a drain thereof is connected to a drain of the n-channel transistor TNR and a drain of the p-channel transistor TPR (i.e., an output terminal of the first inverter), and a gate thereof is connected to the first selection line SL1. A source of the second selection transistor ST2 is connected to the bit line BL1, a drain thereof is connected to a drain of the n-channel transistor TNL and a drain of the p-channel transistor TPL (i.e., an output terminal of the second inverter), and a gate thereof is connected to the second selection line SL2.

In the semiconductor memory device of this embodiment, the potential difference between the bit line BL_1 and the bit line BL_2 is amplified by the combination of the first inverter and the second inverter, without using a sense amplifier. Consequently, the semiconductor memory device of this embodiment can be more highly integrated than the semiconductor memory devices illustrated in FIGS. 1A and 1B.

An example of data reading in such a semiconductor memory device will be described. Here, the case where data in the memory cell MC_1_1 is read is described. In this embodiment, the average threshold voltage of the n-channel transistors is +0.4 V and the threshold voltage variation thereof is 50 mV, while the average threshold voltage of the p-channel transistors is −0.4 V and the threshold voltage variation thereof is 50 mV.

As in Embodiment 1, the bit lines BL_1 and BL_2 are precharged with +0.5 V by a precharge circuit (not illustrated) and then brought into a floating state. The potentials of the wiring VPS1 and the wiring VNS1 are +0.5 V.

Figure 4B:
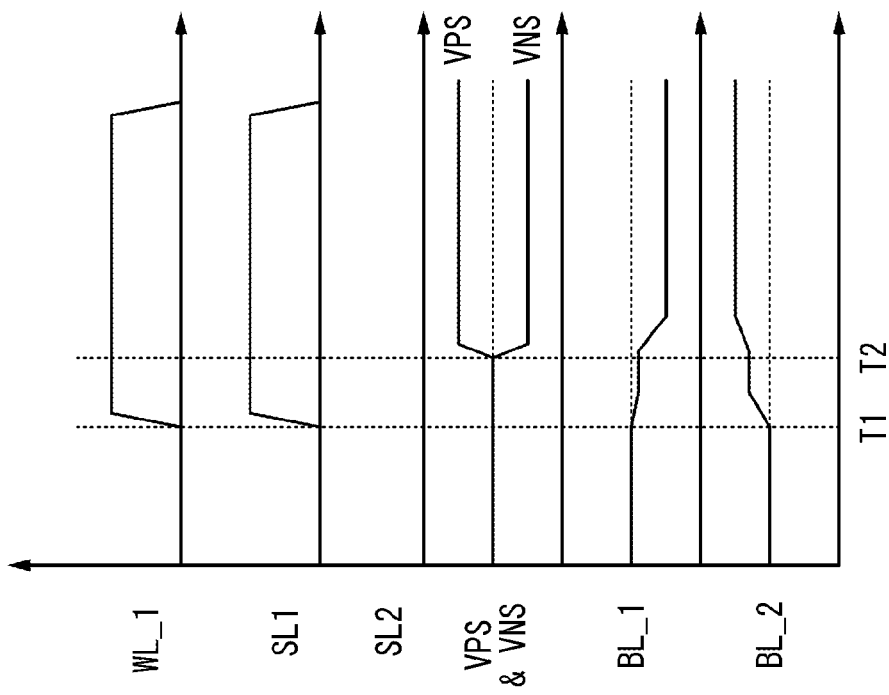

After that, the potential of the word line WL_1 is set at the ON potential to turn on the cell transistor in the memory cell MC_1_1 (time T1 in FIG. 4B). Accordingly, electric charge stored in the capacitor in the memory cell MC_1_1 is discharged to the bit line BL1.

The potential of the bit line BL_1 is determined by the capacitance of the capacitor in the memory cell MC_1_1 and the capacitance of the bit line BL_1. Here, the potential of the capacitor in the memory cell MC_1_1 is originally 0 V, so that the potential of the bit line BL_1 falls from the precharge potential to +0.4 V, for example.

In addition, the potential of the first selection line SL1 is set at the ON potential at the time T1, thereby turning on the first selection transistor ST1. Moreover, the potential of the wiring VPS1 starts to be raised to +1 V and the potential of the wiring VNS1 starts to be lowered to 0 V at the time T1. Note that the timing at which the potential of the first selection line SL1 is set at the ON potential may be before or after the time T1. Note also that the timing at which the potential of the wiring VPS1 starts to be raised to +1 V and the potential of the wiring VNS1 starts to be lowered to 0 V may be before or after the time T1.

Since the potential of the bit line BL_1 is +0.4 V, the first inverter composed of the p-channel transistor TPR and the n-channel transistor TNR outputs a potential higher than the precharge potential. The output potential is transmitted to the bit line BL_2 through the first selection transistor ST1, and the potential of the bit line BL_2 becomes higher than the precharge potential.

After that, the potential of the second selection line SL2 is set at the ON potential, thereby turning on the second selection transistor ST2 (time T2 in FIG. 4B). As a result, the first and second inverters constitute a flip-flop circuit. At this time, the difference between the input potential of the first inverter (the potential of the bit line BL_1) and the input potential of the second inverter (the potential of the bit line BL_2) is sufficiently large and thus is less affected by noise; therefore, the flip-flop circuit composed of the first and second inverters immediately enters a stable state. In such a manner, data can be amplified in a short time.

Since the semiconductor memory device in this embodiment does not include a sense amplifier such as the one used in a known DRAM, data can be written more efficiently. In a general DRAM, after data reading, the potential of a bit line connected to a memory cell in which data needs to be rewritten is changed to a potential corresponding to data to be rewritten. This operation requires time and power because the state of a sense amplifier (flip-flop circuit) needs to be inverted.

In the semiconductor memory device in this embodiment, the first selection transistor ST1 and the second selection transistor ST2 are positioned in the flip-flop circuit composed of the first and second inverters; accordingly, turning off these transistors can destroy the flip-flop circuit and the state stored in the flip-flop circuit.

In the above example, when at least the second selection transistor ST2 is turned off, the path from the second inverter to the bit line BL_1 is interrupted (time T3 in FIG. 4B), so that supply of the potential from the second inverter is stopped. In order to rewrite data, the potential of the bit line BL_1 needs to be set at a potential to be rewritten (+1 V in this case), and yet the state of the flip-flop circuit is not required to be inverted. Consequently, injection of electric charge for charging the bit line BL_1 from 0 V to +1 V will suffice, which means that data can be rewritten in a short time.

Note that in this case, in order to make the potential of the bit line BL_2 opposite in phase to the potential of the bit line BL_1, the first selection transistor ST1 is also turned off at the time T3.

In this period, connection between bit lines where data is not rewritten and output terminals of the second inverters connected to these bit lines is also broken while the potentials of these bit lines are held at potentials corresponding to the original data.

Then, transistors in memory cells are turned off, whereby a capacitor in a memory cell where data is to be rewritten holds a potential corresponding to data to be rewritten whereas a capacitor in a memory cell where data is not rewritten holds a potential corresponding to the original data.

Figure 3B:
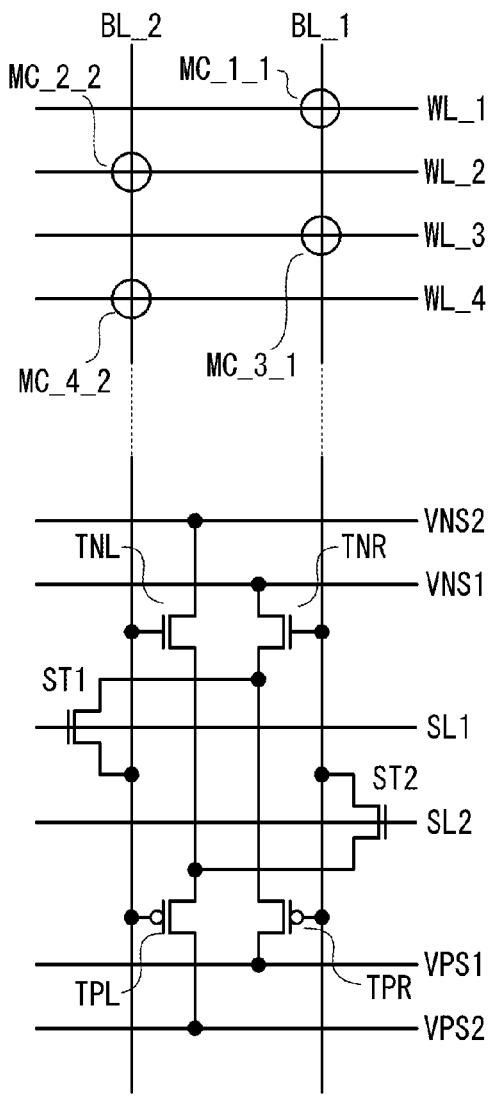

In the semiconductor memory device illustrated in FIG. 3A, power supply voltages for the first inverter and the second inverter are controlled at the same time; alternatively, the power supply voltages for the first inverter and the second inverter may be individually controlled as illustrated in FIG. 3B. That is, the wiring VPS1 and the wiring VNS1 that supply power to the first inverter and the wiring VPS2 and the wiring VNS2 that supply power to the second inverter may be separately provided.

It is possible that the potentials of the wiring VPS2 and the wiring VNS2 are +0.5 V at first and are changed to +1 V and 0 V, respectively, at, before, or after the time T2 in FIG. 4B. Thus, power consumption can be further reduced.

(Embodiment 3)

In Embodiment 3, examples of a semiconductor memory device according to one embodiment of the present invention will be described with reference to FIGS. 5A and 5B. The semiconductor devices illustrated in FIGS. 5A and 5B can operate like the semiconductor memory devices described in Embodiments 1 and 2.

Figure 5A:
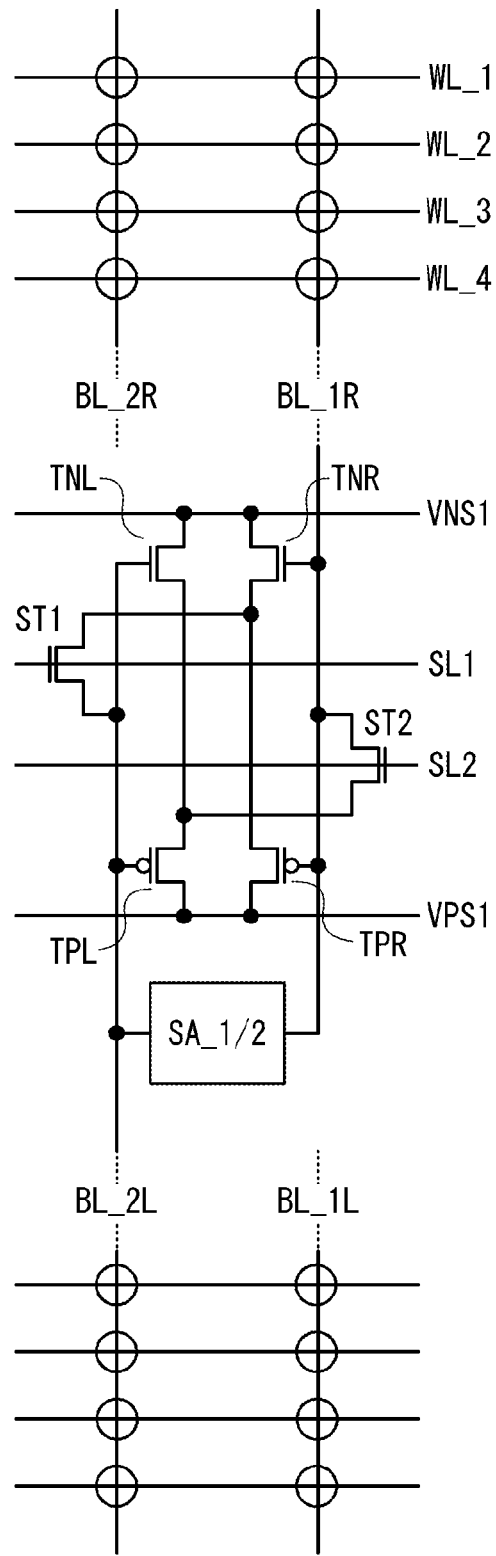
FIGS. 5A and 5B each illustrate a circuit example of a semiconductor memory device of the present invention.

The semiconductor memory device illustrated in FIG. 5A includes the word lines WL, the bit lines BL perpendicular to the word lines WL, the first selection line SL1 and the second selection line SL2 parallel to the word lines WL, and a plurality of memory cells MC. The bit line BL is divided around the first selection line SL1 or the second selection line SL2, resulting in an open bit line architecture.

The semiconductor memory device also includes the first selection transistor ST1, the second selection transistor ST2, the p-channel transistor TPL, the p-channel transistor TPR, the n-channel transistor TNL, the n-channel transistor TNR, and the wiring VPS1 and the wiring VNS1 that supply potentials to sources of these p-channel and n-channel transistors.

The p-channel transistor TPR and the n-channel transistor TNR constitute a first inverter. The p-channel transistor TPL and the n-channel transistor TNL constitute a second inverter. A source of the first selection transistor ST1 is connected to the bit line BL_2L, a drain thereof is connected to a drain of the n-channel transistor TNR and a drain of the p-channel transistor TPR (i.e., an output terminal of the first inverter), and a gate thereof is connected to the first selection line SL1. A source of the second selection transistor ST2 is connected to the bit line BL_1R, a drain thereof is connected to a drain of the n-channel transistor TNL and a drain of the p-channel transistor TPL (i.e., an output terminal of the second inverter), and a gate thereof is connected to the second selection line SL2.

The semiconductor memory device also includes the sense amplifier SA_1/2. The sense amplifier SA_1/2 is used to amplify the potential difference between the bit line BL_1R and the bit line BL_2L.

Figure 5B:
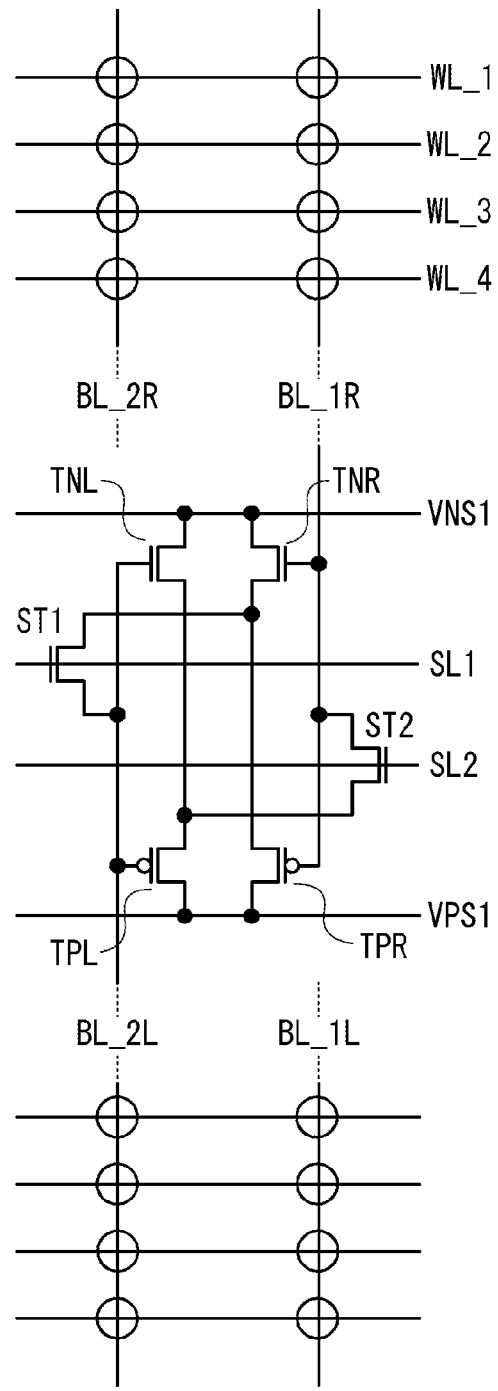

In the semiconductor memory device illustrated in FIG. 5B, the sense amplifier in FIG. 5A is not provided in view of higher integration, and a potential is amplified by the first inverter and the second inverter.

In the semiconductor memory devices illustrated in FIGS. 5A and 5B, power supply voltages for the first inverter and the second inverter are controlled at the same time; alternatively, the power supply voltages for the first inverter and the second inverter may be individually controlled as in Embodiments 1 and 2.

(Embodiment 4)

In Embodiment 4, an example of a semiconductor memory device according to one embodiment of the present invention will be described with reference to FIGS. 6A to 6D and FIG. 7. Note that in this embodiment, the same hatch pattern indicates the same kind of component.

FIGS. 6A to 6D illustrate an example of the layout of the first and second inverters described in Embodiment 2. Note that a known technique for fabricating a semiconductor integrated circuit can be referred to for the details. In the layout illustrated in FIGS. 6A to 6D, the first and second inverters are formed with a width of six bit lines.

Figure 6A:
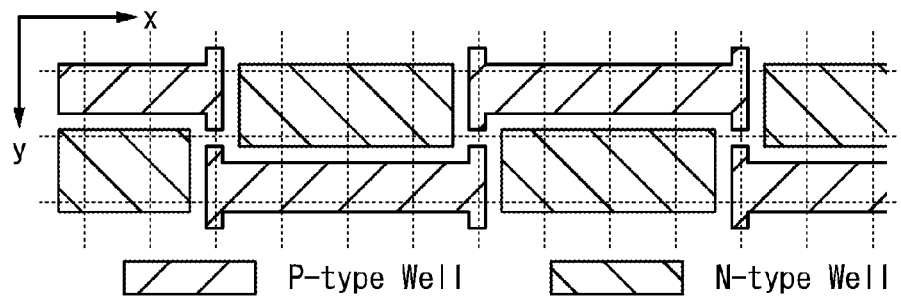
FIGS. 6A to 6D illustrate a layout example of a semiconductor memory device of the present invention.

FIG. 6A illustrates the position of portions that are not covered with an element isolation insulator in n-type wells and p-type wells formed on a single crystal semiconductor substrate. The n-type wells and the p-type wells are alternately formed in the bit line direction (x direction).

Here, the y-direction length of the middle of the n-type well is larger than that of the middle of the p-type well so that the channel width of a p-channel transistor (formed over the n-type well) included in the inverter is made larger than that of an n-channel transistor (formed over the p-type well).

The x-direction length of the p-type well is larger than that of the n-type well so that the channel length of the n-channel transistor included in the inverter is made larger than that of the p-channel transistor.

Figure 6B:
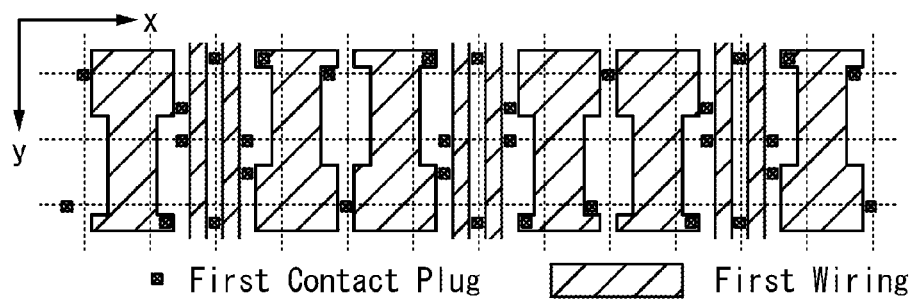
Figure 6C:
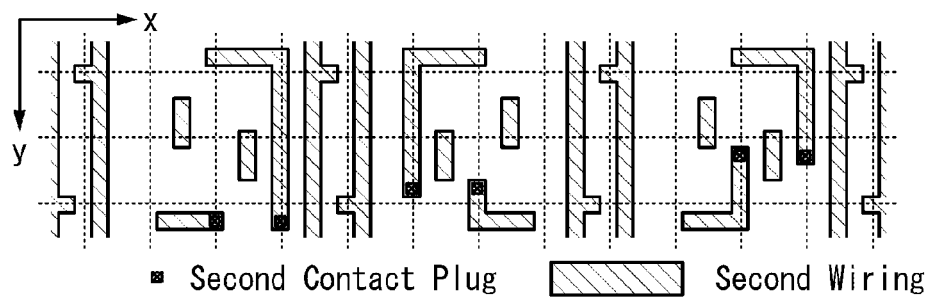
Figure 6D:
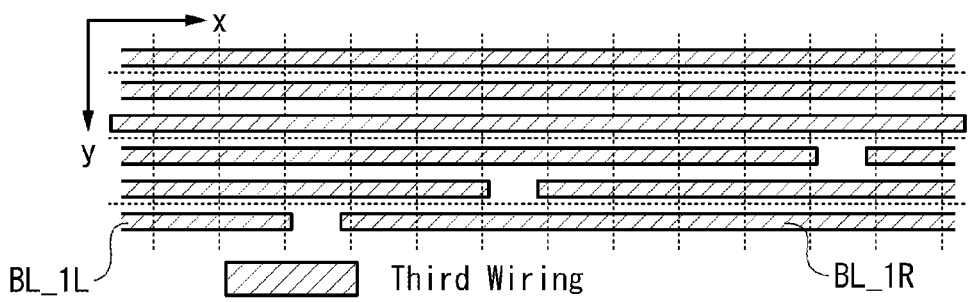

FIGS. 6B to 6D illustrate a layout example of first wirings and first contact plugs (FIG. 6B), second wirings and second contact plugs (FIG. 6C), and third wirings (FIG. 6D) that are formed over the n-type wells and the p-type wells.

In the case where memory cells are formed using a thin-film-shaped semiconductor, the thin-film-shaped semiconductor may be formed over the second wirings or the third wirings. In this case, the memory cells can be fabricated over inverters or the like, resulting in higher integration.

Here, the first wirings serve as gates of the transistors. Note that the threshold voltage variation of the transistors constituting the first and second inverters needs to be small; thus, the width of the wirings serving as the gates of these transistors is preferably larger than the feature size (F) so that the transistors have a large channel area.

When an n-channel transistor and a p-channel transistor constitute an inverter, their channel length and channel width are preferably determined in consideration of the mobility so that the transistors have symmetrical on characteristics. It is preferable that a value obtained by dividing the channel width by the channel length of the p-channel transistor included in the inverter be 2.5 times to 4 times as large as a value obtained by dividing the channel width by the channel length of the n-channel transistor.

In addition, the n-channel transistor and the p-channel transistor preferably have approximately the same channel area in consideration of the threshold voltage variation and the capacitance ratio of the transistors to the bit lines. In other words, the channel area of the n-channel transistor is preferably designed to be in the range of 80% to 125% of that of the p-channel transistor. In this case, the channel area of the n-channel transistor is preferably 10 $F^2$ or more, further preferably 20 $F^2$ or more.

Given that, for example, the transistors have a rectangular channel and that the channel length and channel width of the n-channel transistor are 5 F and 3 F, respectively, and the channel length and channel width of the p-channel transistor are 3 F and 5 F, respectively, the transistors have substantially the same channel area and substantially the same on-state current. Since the channel area of these transistors is 15 times that of a normal transistor, the threshold voltage variation is reduced. The threshold voltage variation is inversely proportional to the square root of the channel area and is reduced to about ¼ here.

Similarly, it is possible that the channel length and channel width of the n-channel transistor are 7 F and 4 F, respectively, and the channel length and channel width of the p-channel transistor are 4 F and 7 F, respectively. Alternatively, it is possible that the channel length and channel width of the n-channel transistor are 12 F and 7 F, respectively, and the channel length and channel width of the p-channel transistor are 7 F and 12 F, respectively.

If it is difficult to form a rectangular channel such as the ones described above because of layout limitation, the transistors may be designed so that their channels have a polygonal shape or the like to substantially obtain needed on-state current and channel area.

In the inverter of the semiconductor memory device in this embodiment, the p-channel transistor has a channel length of 3 F and a channel width of 5 F, and the n-channel transistor has a channel length of 5 F and a channel width of 3 F. Consequently, the threshold voltage variation is reduced to approximately ¼ compared to that of a transistor having a channel length of 1 F and a channel width of 1 F.

Among the first wirings, the one extended in the y direction serves as the first selection line or the second selection line. The first and second selection transistors are n-channel transistors having a channel length of 1 F and a channel width of 3 F.

Consequently, in a series circuit of the first selection transistor and the first inverter (or of the second selection transistor and the second inverter), the major resistance is the resistance of the first inverter (or the second inverter), whereas the resistance of the first selection transistor (or the second selection transistor) is sufficiently low and is thus of little relevance to the operation speed.

Among the second wirings, the one extended in the y direction serves to supply power to the inverter. The third wirings are the bit lines and, for example, as illustrated in FIG. 6D, the third wiring is separated into the bit line BL_1L and the bit line BL_1R near a portion where the first wiring corresponding to the first selection line or the second selection line is provided.

Figure 7:
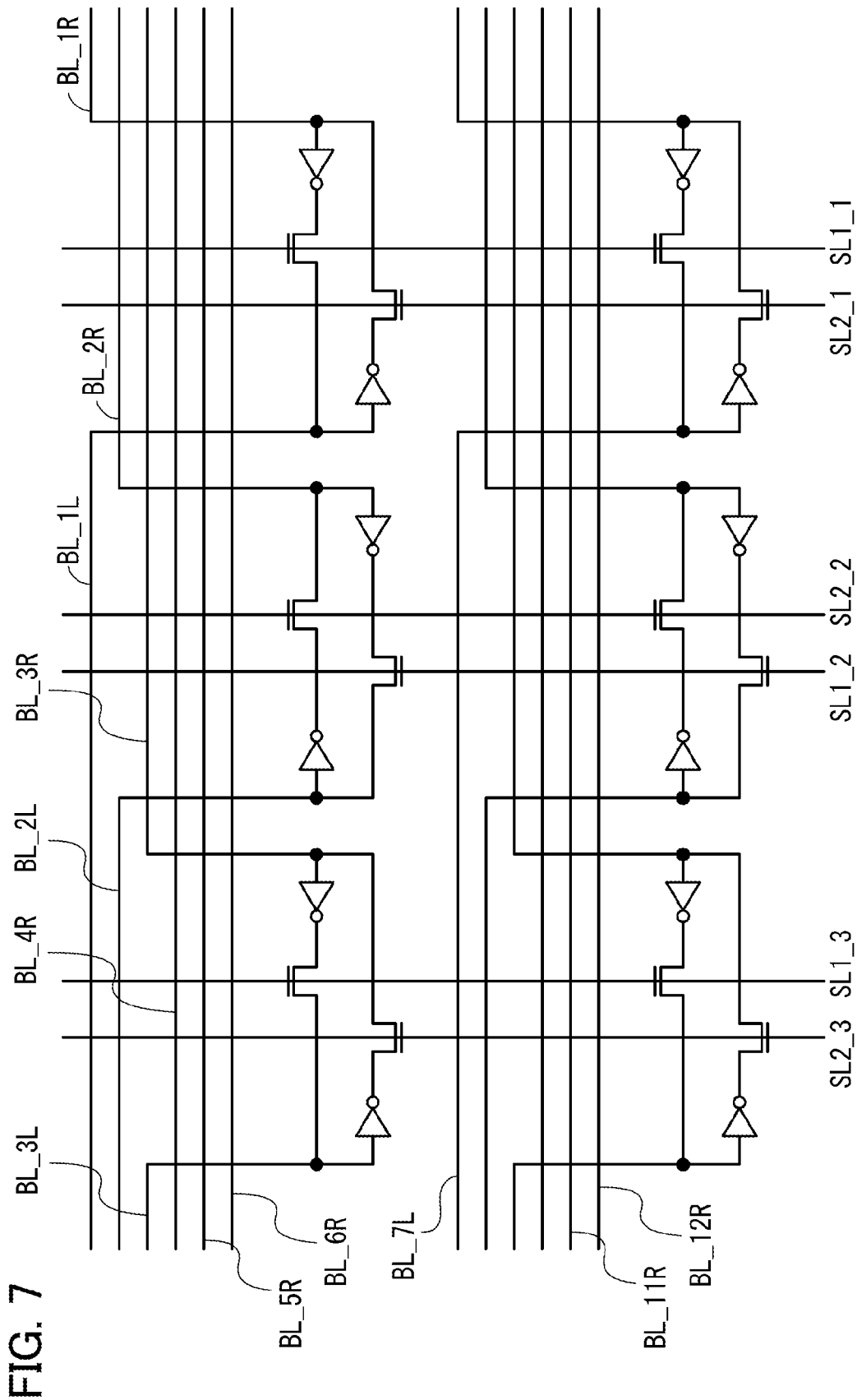
FIG. 7 illustrates a circuit example of a semiconductor memory device of the present invention.

FIG. 7 is a circuit diagram of a portion obtained by using the layouts illustrated in FIGS. 6A to 6D and its periphery. As illustrated in FIG. 7, the first and second inverters are formed with a width of six bit lines, so that the same pattern is repeated every six bit lines.

In the semiconductor memory device of this embodiment, when the potential of the first selection line SL1 is set at the ON potential, a potential obtained by inverting the potential of the bit line BL_nR (n is an integer) is output to the bit line BL_nL. Further, when the potential of the second selection line SL2 is set at the ON potential, a potential obtained by inverting the potential of the bit line BL_nL is output to the bit line BL_nR.

As seen from the layout illustrated in FIGS. 6A to 6D, the power supply voltages for the first inverter and the power supply voltages for the second inverter can be individually controlled in the semiconductor memory device of this embodiment.

This application is based on Japanese Patent Application serial No. 2011-232374 filed with Japan Patent Office on Oct. 24, 2011, the entire contents of which are hereby incorporated by reference.

What is claimed is:

1. A semiconductor memory device comprising:
a first bit line;
a second bit line;
a memory cell connected to one of the first bit line and the second bit line;
a first inverter;
a first switch;
a second inverter; and
a second switch,
wherein the first inverter is connected to the first switch,
wherein the second inverter is connected to the second switch,
wherein the first bit line is connected to the first inverter,
wherein the second bit line is connected to the first switch,
wherein the first bit line is connected to the second switch,
wherein the second bit line is connected to the second inverter,
wherein the semiconductor device is configured to take a state that the first switch is on and the second switch is off, and
wherein the semiconductor device is configured that, after the first switch is turned on, the second switch is turned on so that a loop of the first inverter, the first switch, the second inverter, and the second switch is formed.

2. The semiconductor memory device according to claim 1, wherein a transistor in the memory cell and a transistor in the first inverter are provided in different layers.

3. The semiconductor memory device according to claim 1, wherein the first switch comprises a plurality of transistors.

4. The semiconductor memory device according to claim 1, wherein the first switch comprises transistors with different conductivity types.

5. The semiconductor memory device according to claim 1,
wherein a channel area of an n-channel transistor included in the first inverter is from 80% to 125% of a channel area of a p-channel transistor included in the first inverter, and
wherein a value obtained by dividing a channel width by a channel length of the p-channel transistor is 2.5 times to 4 times as large as a value obtained by dividing a channel width by a channel length of the n-channel transistor.

6. The semiconductor memory device according to claim 1, wherein a channel area of an n-channel transistor included in the first inverter is 10 $F^2$ or larger, where F is the feature size.

7. A semiconductor memory device comprising:
a first bit line;
a second bit line;
a memory cell connected to one of the first bit line and the second bit line;
a first inverter;
a second inverter;
a first switch;
a second switch;
a first power supply line connected to the first inverter;
a second power supply line connected to the first inverter;
a third power supply line connected to the second inverter;
a fourth power supply line connected to the second inverter, and
wherein the first inverter is connected to the first bit line and connected to the second bit line via the first switch,
wherein the second inverter is connected to the second bit line and connected to the first bit line via the second switch,
wherein the semiconductor device is configured to take a state that the first switch is on and the second switch is off, and wherein the semiconductor device is configured that, after the first switch is turned on, the second switch is turned on so that a loop of the first inverter, the first switch, the second inverter, and the second switch is formed.

8. The semiconductor memory device according to claim 7, wherein a transistor in the memory cell and a transistor in the first inverter are provided in different layers.

9. The semiconductor memory device according to claim 7, wherein the switch comprises a plurality of transistors.

10. The semiconductor memory device according to claim 7, wherein the switch comprises transistors with different conductivity types.

11. The semiconductor memory device according to claim 7,
wherein a channel area of an n-channel transistor included in the first inverter is from 80% to 125% of a channel area of a p-channel transistor included in the first inverter, and
wherein a value obtained by dividing a channel width by a channel length of the p-channel transistor is 2.5 times to 4 times as large as a value obtained by dividing a channel width by a channel length of the n-channel transistor.

12. The semiconductor memory device according to claim 7, wherein a channel area of an n-channel transistor included in the first inverter is 10 $F^2$ or larger, where F is the feature size.

* * * * *